(12) United States Patent
Yamasaki

(10) Patent No.: US 7,079,371 B2
(45) Date of Patent: Jul. 18, 2006

(54) CAPACITOR DEVICE, ELECTRONIC PARTS PACKAGING STRUCTURE, AND METHOD OF MANUFACTURING THE CAPACITOR DEVICE

(75) Inventor: Tomoo Yamasaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/020,062

(22) Filed: Dec. 23, 2004

(65) Prior Publication Data

US 2005/0141169 A1  Jun. 30, 2005

(30) Foreign Application Priority Data

Dec. 25, 2003  (JP)  ............................. 2003-430568

(51) Int. Cl.
*H01G 4/005* (2006.01)

(52) U.S. Cl. .................... 361/303; 361/306.3; 361/312

(58) Field of Classification Search ............ 361/306.3, 361/311–313, 321.2, 309, 306.2, 305, 308.3, 361/306.1; 257/532, 296, 306, 310

See application file for complete search history.

(56) References Cited

U.S. PATENT DOCUMENTS 6,498,714 B1  12/2002  Fujisawa et al.
6,678,144 B1 *  1/2004  Higashi et al. .......... 361/306.3

FOREIGN PATENT DOCUMENTS

JP  2001-110675  4/2001
JP  2002-260960  9/2002

* cited by examiner

*Primary Examiner*—Anthony Dinkins
(74) *Attorney, Agent, or Firm*—Armstrong, Kratz, Quintos, Hanson & Brooks, LLP

(57) ABSTRACT

In a capacitor device of the present invention includes a substrate, a plurality of lower electrodes formed on the substrate, a plurality of dielectric films formed on a plurality of lower electrodes respectively in a state that the dielectric films are separated mutually, and upper electrodes formed on a plurality of dielectric films respectively, a plurality of capacitors each composed of the lower electrode, the dielectric film, and the upper electrode are arranged on the substrate respectively, and each of the dielectric films in a plurality of capacitors has a different film thickness.

11 Claims, 14 Drawing Sheets

Power supply $C_1$  $C_2$  $C_3$

Load (LSI)

GND $C_1+C_2+C_3=90nF$ $C_1+C_2+C_3=30nF$、each $ESR=10m\Omega$、each $ESL=50pH$ (plan view)

C1+C2+C3=90nF
C1=3C2=5C3

C1=10nF、each ESR=10mΩ、each ESL=50pH

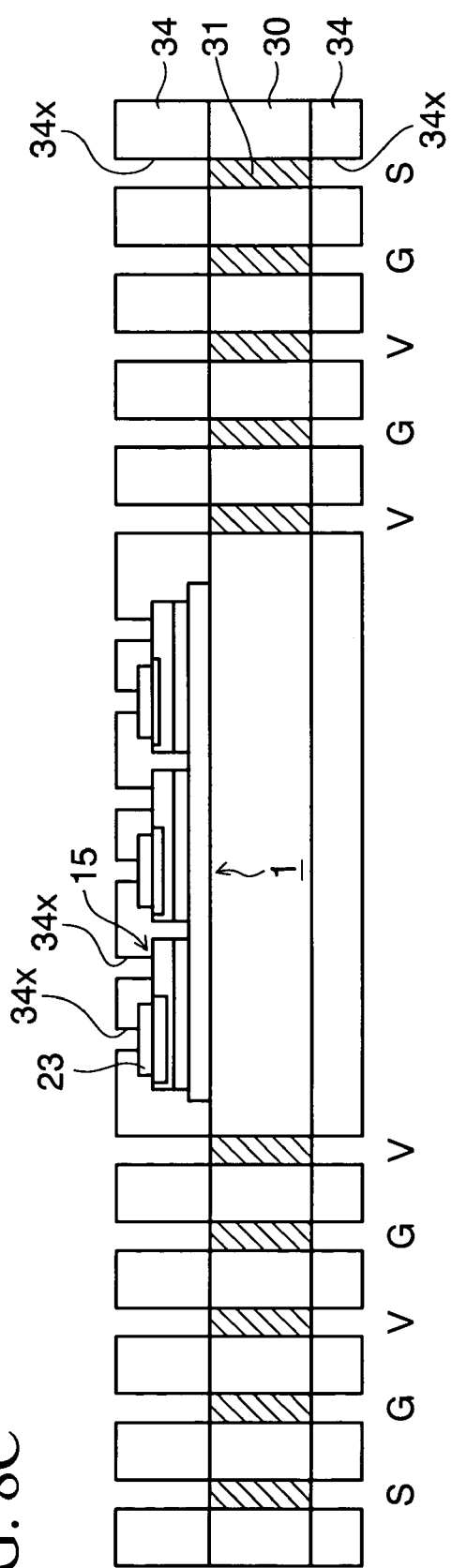
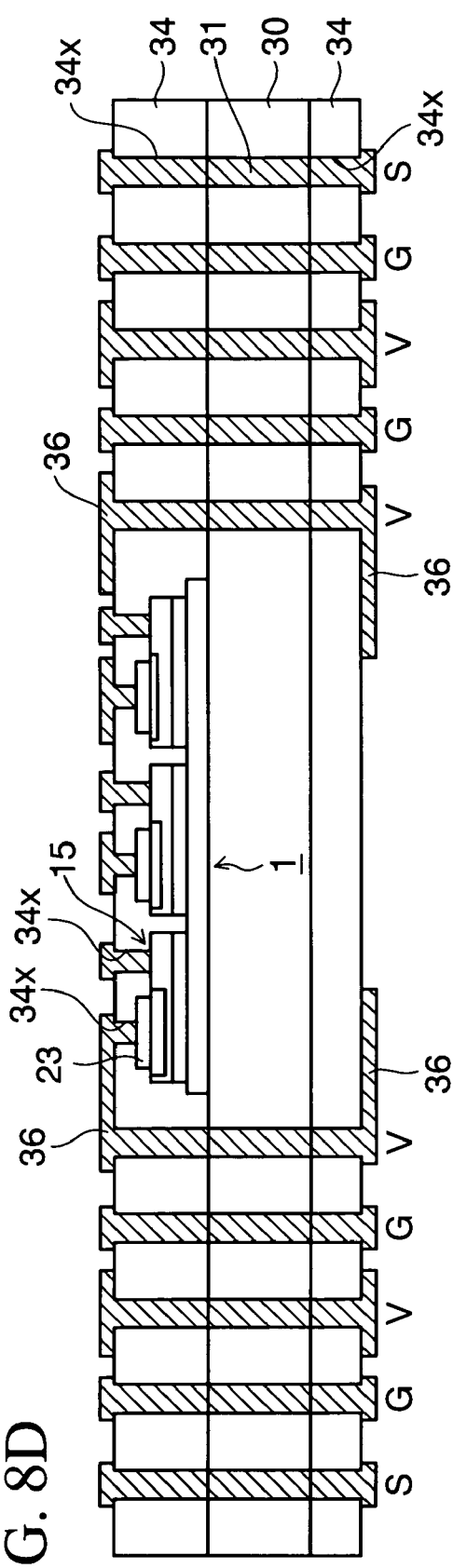
FIG. 8C
FIG. 8D

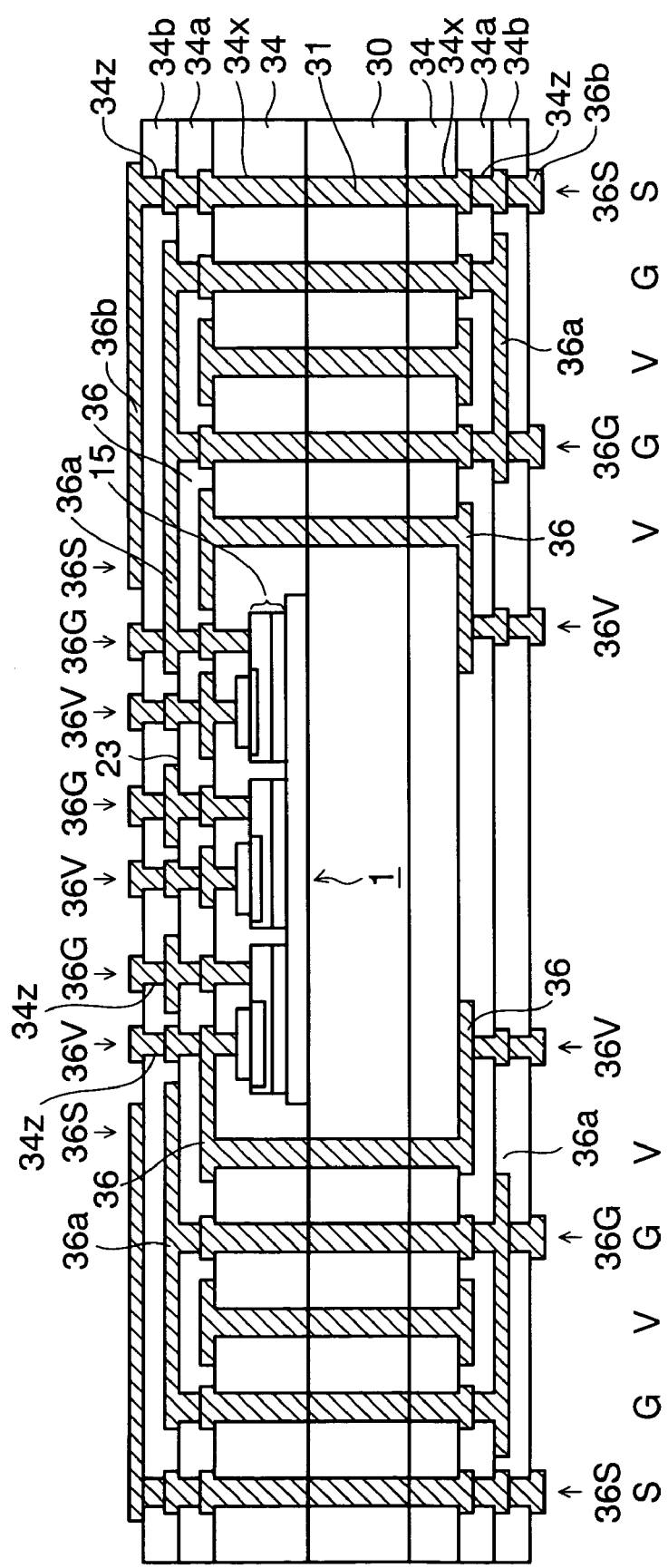

CAPACITOR DEVICE, ELECTRONIC PARTS PACKAGING STRUCTURE, AND METHOD OF MANUFACTURING THE CAPACITOR DEVICE

BACKGROUND OF THE INVENTION

1. Field of the Invention

The present invention relates to a capacitor device, an electronic parts packaging structure, and a method of manufacturing the capacitor device and, more particularly, a capacitor device capable of being applied to a decoupling capacitor that is arranged on a circuit substrate on which high-speed operated electronic parts are mounted to stabilize a power supply voltage and also reduce a high-frequency noise, an electronic parts packaging structure in which such capacitor device is built, and a method of manufacturing the capacitor device.

2. Description of the Related Art

In recent years, reduction in the power-supply voltage due to increase in a processing speed and reduction in power consumption is accelerated in the digital LSIs including the microprocessor. In such digital LSIs, a power-supply voltage of the LSI is apt to become unstable when the impedance of the LSI is suddenly varied, and so forth. Also, a stable operation in a higher-frequency (GHz) range is required of high-speed operated digital LSIs, and thus it is needed to prevent the malfunction of the LSI due to the high-frequency noise.

Therefore, for the purpose of stabilizing the power-supply voltage and reducing the high-frequency noise, the decoupling capacitor is arranged between a power-supply line and a ground line of the LSI.

For instance, in Patent Literature 1 (Patent Application Publication (KOKAI) 2001-110675) and Patent Literature 2 (Patent Application Publication (KOKAI) 2002-260960), as the capacitor incorporated into the printed wiring substrate, the capacitor utilizing the metal oxide film obtained by applying the anodic oxidation to the valve metal such as tantalum, or the like as the dielectric layer is set forth.

In the circuit substrate having the conventional decoupling capacitor, such capacitor is packaged onto the area of the circuit substrate adjacent to the area on which the LSI chip is packaged. In this case, since leads must be provided between the LSI chip and the capacitor, a relatively large inductance is present between these leads. Therefore, even though the decoupling capacitor is provided, an effect of suppressing a variation in the power-supply voltage applied to the high-speed operated electronic parts and also reducing the high-frequency noise is lessened.

As a result, the method of setting the wiring distance between the LSI chip and the capacitor to the shortest length by placing the decoupling capacitor directly under the LSI chip to reduce the inductance is proposed.

However, there is a limit to the reduction in the parasitic inductance even though the wiring distance between the LSI chip and the capacitor is set to the shortest length. Then, when the higher frequency of the LSI is further forwarded, such a situation is supposed that either the power-supply voltage of the LSI becomes unstable or the malfunction of the LSI is caused by the high-frequency noise. As a result, the decoupling capacitor having the characteristic that its impedance is reduced over a wider frequency band is requested.

SUMMARY OF THE INVENTION

It is an object of the present invention to provide a capacitor device capable of being applied to a decoupling capacitor that can reduce an impedance in a wide frequency band and can be suited to a higher frequency of electronic parts, an electronic parts packaging structure in which such capacitor device is built, and a method of manufacturing the capacitor device.

The present invention is associated with a capacitor device that comprises a substrate; a plurality of lower electrodes formed on the substrate; a plurality of dielectric films formed on the plurality of lower electrodes respectively in a state that the dielectric films are separated mutually; and upper electrodes formed on the plurality of dielectric films respectively; wherein a plurality of capacitors each composed of the lower electrode, the dielectric film, and the upper electrode are arranged on the substrate respectively, and each of the dielectric films in the plurality of capacitors has a different film thickness.

In the capacitor device of the present invention, a plurality of capacitors constructed by the lower electrode, the dielectric film, and the upper electrode respectively are formed on the substrate as one chip. Then, the film thicknesses of respective dielectric films are set differently among a plurality of capacitors, and thus the electrostatic capacities of respective capacitors are differentiated.

In the capacitor device of the present invention, a plurality of capacitors are connected in parallel between the power-supply line and the ground line of the circuit substrate on which the high-speed operated electronic parts are mounted, and this capacitor device acts as the decoupling capacitor. Since the decoupling capacitor is constructed by connecting a plurality of capacitors each having the different electrostatic capacity in parallel, the resonance frequencies are shifted among a plurality of capacitors and therefore the impedance can be reduced in a wide frequency band.

Meanwhile, the resonance frequency of the capacitor depends on not only the electrostatic capacity but also the inductance. However, in the capacitor device of the present invention, since it is not needed that the basic structure of the capacitor such as the electrode area, and the like is not changed, the inductance can be set identically among respective capacitors.

Therefore, when the electrical design is conducted to attain the impedance reduction over a wide frequency band by adjusting the resonance frequencies of respective capacitors, there is no need to take the change in the inductances of respective capacitors into consideration, and only the change in the electrostatic capacities should be considered. In addition, since the resonance frequency of the capacitor has such a characteristic that such resonance frequency changes in inverse proportion to the electrostatic capacity, the electrical design can be made extremely easy.

Also, the capacitor device of the present invention is constructed by forming a plurality of capacitors on the substrate as one chip. Therefore, a packaging cost can be reduced rather than the case where a plurality of capacitor parts having the different electrostatic capacity respectively are packaged individually, and also such capacitor device can respond to the high-density packaging.

Further, reduction in thickness of the capacitor device can be attained by reducing a thickness of the substrate, and in addition the capacitor device of the present invention can be arranged directly under the electronic parts. Therefore, the parasitic inductance can be reduced widely.

Also, in one preferred mode of the present invention, respective dielectric films of the capacitor device are made of the metal oxide film that is formed by applying the anodic oxidation to the valve metal film. In the case of this mode, first the valve metal film is formed on the conductive film that is formed on the substrate. Then, the resist film in which the opening portions are provided in the predetermined portions in the valve metal film is formed, and then the metal oxide film is formed by oxidizing the valve metal film exposed from the opening portions by virtue of the anodic oxidation. Then, the dielectric films each having the different dielectric film thickness are formed in different areas of the valve metal film by repeating this step while changing the conditions of the anodic oxidation. Then, the upper electrodes are formed on the dielectric film, and then the lower electrodes are formed by patterning the valve metal film and the conductive film. As a result, a plurality of capacitors in which the film thickness of each dielectric film is different respectively are easily formed on the substrate as one chip.

As described above, the capacitor device of the present invention has the small impedance in the wide frequency band. As a result, an effect of suppressing a variation in the power-supply voltage applied to the high-speed operated electronic parts and also reducing the high-frequency noise can be enhanced.

BRIEF DESCRIPTION OF THE DRAWINGS

FIGS. 8A to 8H are sectional views showing a method of manufacturing an electronic parts packaging structure in which the capacitor device according to the first embodiment of the present invention is built.

DETAILED DESCRIPTION OF THE PREFERRED EMBODIMENTS

Embodiments of the present invention will be explained with reference to the accompanying drawings hereinafter.

Figure 1:
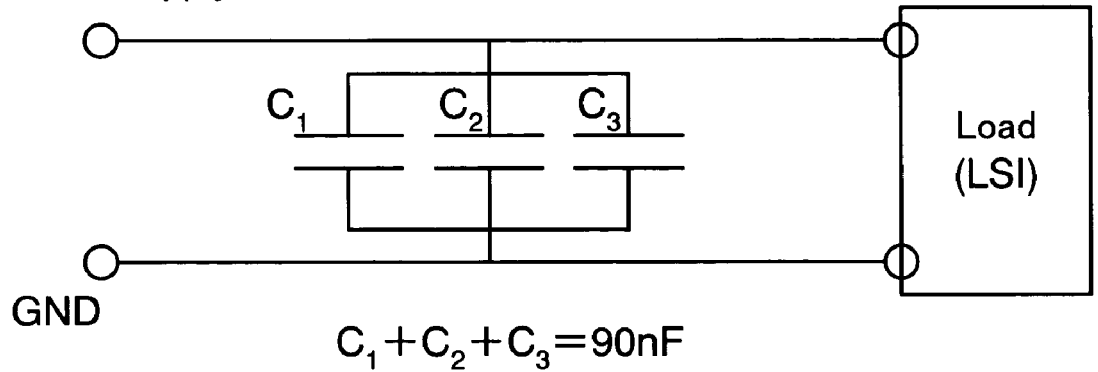
FIG. 1 is a diagram showing an equivalent circuit of a decoupling capacitor in which a plurality of capacitors are connected in parallel between a power supply line and a ground line of a circuit board on which the load (LSI) is mounted.
Figure 2:
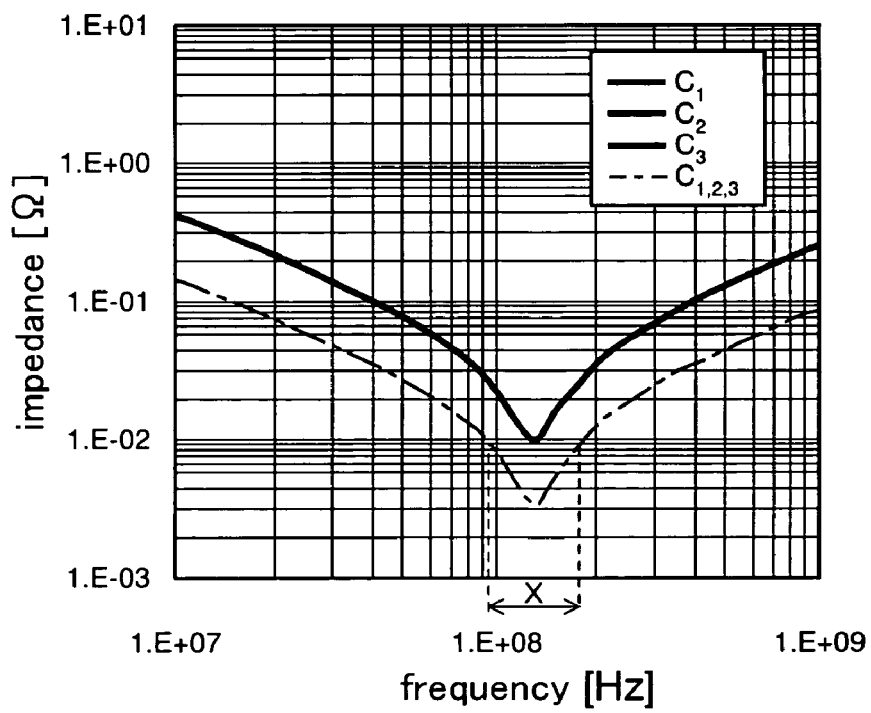
FIG. 2 is a view showing the impedance characteristic of the decoupling capacitor in FIG. 1.

Prior to explanation of a capacitor device according to embodiments of the present invention, the decoupling capacitor having the structure that a plurality of capacitors are connected in parallel between the power-supply line and the ground line of the circuit substrate on which the LSI chip is mounted will be explained hereunder. FIG. 1 is a diagram showing an equivalent circuit of a decoupling capacitor in which a plurality of capacitors are connected in parallel between a power supply line and a ground line of a circuit board on which the load (LSI) is mounted. FIG. 2 is a view showing the impedance characteristic of the decoupling capacitor in FIG. 1.

Normally, the decoupling capacitor adapted for use with the high-performance LSI is requested to have the low impedance over a wide range from a low-frequency range to a high-frequency range. An example of the decoupling circuit taking account of such request is shown in FIG. 1. A first capacitor $C_1$, a second capacitor $C_2$, and a third capacitor $C_3$ all having the same electrostatic capacity are connected in parallel between the power-supply line and the ground line (GND) of the circuit substrate on which the load (LSI) is mounted.

The impedance characteristic of the individual capacitors ($C_1$, $C_2$, $C_3$) has the characteristic indicated by a solid line in FIG. 2. Then, the impedance characteristic of the decoupling capacitor $C_{1,2,3}$ constructed by connecting respective capacitors ($C_1$, $C_2$, $C_3$) in parallel is indicated by a chain line in FIG. 2. A frequency range X in which the impedance of the decoupling capacitor $C_{1,2,3}$ is reduced smaller than 10 m $\Omega$ or less becomes 90 to 180 MHz, and such decoupling capacitor has an effect to reduce the impedance over a wide frequency band.

The electrostatic capacity of capacitors ($C_1$, $C_2$, $C_3$) at this time is 30 nF (a sum of the electrostatic capacities is 90 nF) respectively. An equivalent series resistance (ESR) is 10 m $\Omega$ respectively, and also an equivalent series inductance (ESL) is 50 pH respectively.

Also, it is known that, if the decoupling capacitor is constructed by connecting in parallel a plurality of capacitors the electrostatic capacities of which are mutually different, its impedance in a wide frequency band can be reduced further.

However, these capacitors $C_1$, $C_2$, $C_3$ are not manufactured as one chip, and the decoupling capacitor is constructed by packaging individual capacitor parts. Therefore, not only an increase in packaging cost is brought about but also it is difficult for the decoupling capacitor to be adapted for use with the high-density packaging. Also, in the case where a plurality of capacitor parts whose electrostatic capacity is changed by changing an electrode area are used, electrical design must be conducted with regard to the inductance as well as the electrostatic capacity. Thus, the problem exists that the electrical design becomes complicated.

The inventors of this application studied earnestly the decoupling capacitor having the structure that makes the impedance reduction in the above wide frequency band possible. As a result, the inventors of this application found the fact that, if the electrostatic capacities are differentiated mutually by controlling a film thickness of the dielectric film of the capacitor without change of the inductance, not only the decoupling capacitor can be manufactured as one chip to reduce a packaging cost but also the impedance can be reduced in a wider frequency band by an easy electrical design.

(First Embodiment)

Next, a capacitor device according to a first embodiment of the present invention will be explained hereunder. FIGS. 3A to 3J are sectional views showing a method of manufacturing a capacitor device according to a first embodiment of the present invention in sequence.

Figure 3A:
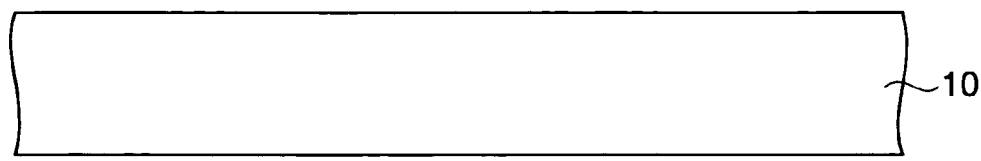
FIGS. 3A to 3J are sectional views showing a method of manufacturing a capacitor device according to a first embodiment of the present invention.

First, as shown in FIG. 3A, a core substrate 10 made of silicon, glass, ceramic, resin, or the like, or a metal such as iron-nickel alloy, aluminum, or the like is prepared. In the case where a resin substrate is used as the core substrate 10, it is preferable that the resin containing fillers such as silica and having a coefficient of thermal expansion of 5 to 30 ppm/K should be employed.

Also, when the thin-type capacitor device is manufactured, the core substrate 10 having a thickness of 50 μm or less is employed. When the thin-type core substrate 10 is employed, the core substrate may be fixed to the supporting member and then the supporting member may be removed after manufacturing steps are ended. Alternately, the core substrate 10 having a normal thickness is employed and then the back surface of the core substrate 10 may be ground after the production of the capacitor is finished.

Figure 3B:
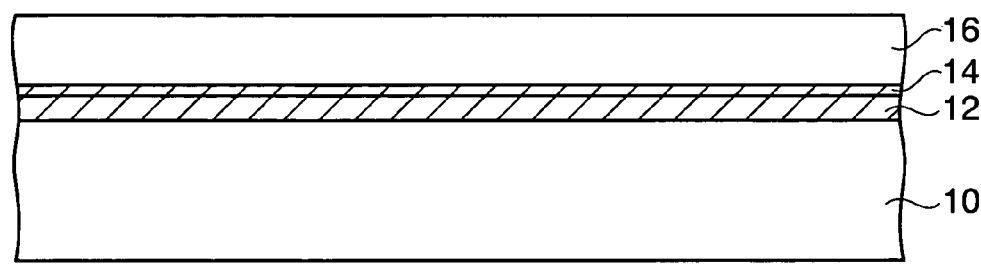

Then, as shown in FIG. 3B, a conductive film 12 serving as a lower electrode of the capacitor and having a film thickness of about 10 μm, for example, is formed on the core substrate 10. A copper (Cu) is employed as the material of the conductive film 12, for example, and such conductive film 12 is formed by the sputtering method, or the like. In this case, when a silicon substrate or a metal substrate is employed as the core substrate 10, an insulating film is formed on the core substrate and then the conductive film 12 is formed.

Then, as also shown in FIG. 3B, a first intermediate film 14 made of titanium (Ti), aluminum (Al), or the like is formed on the conductive film 12. Then, a tantalum film (Ta film) 16 whose film thickness is 600 nm, for example, is formed on the first intermediate film 14 by the sputtering method or the CVD method. The tantalum is an example of the valve metal. Here, the "valve metal" signifies the metal having such a so-called valve action that its metal oxide obtained by applying the anodic oxidation passes an electric current therethrough only in one direction but hardly passes the electric current therethrough in the opposite direction. As such valve metal, there are aluminum (Al), titanium (Ti), hafnium (Hf), niobium (Nb), zirconium (Zr), etc. in addition to tantalum. In the present embodiment, the metal oxide film obtained by selectively oxidizing the valve metal film is employed as the dielectric film of the capacitor.

Figure 3C:
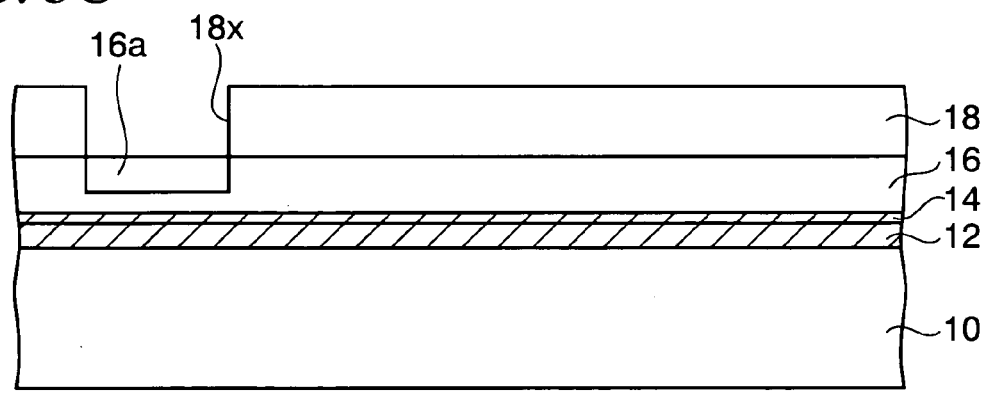

Then, as shown in FIG. 3C, a first resist film 18 in which an opening portion 18x is provided in its portion, in which a first dielectric film of a first capacitor is formed, on the tantalum film 16 is formed by the photolithography.

Then, the portion of the tantalum film 16 exposed from the opening portion 18x in the first resist film 18 is oxidized by the first anodic oxidation in the film thickness direction. Thus, a first tantalum oxide film ($Ta_2O_5$ film) 16a is formed. For example, the core substrate 10 on which the tantalum film 16 is formed is dipped into an almost 0.01% sodium citrate solution used as the electrolysis solution, and then the tantalum film 16 is connected to the anode to supply an electric current. In the first anodic oxidation step, a voltage is applied up to 300 V in a constant current mode, and then the voltage is applied in a constant voltage mode until a current value comes up to a 10% value of an initial current after the voltage reached 300 V. As a result, the first tantalum oxide film 16a of almost 450 nm film thickness is formed. The first tantalum oxide film 16a is used later as a first dielectric film of a first capacitor. Then, the first resist film 18 is removed.

In the anodic oxidation step, following reactions occur in the anode, the cathode, and the electrolysis solution and the anode (tantalum film) is oxidized.

Electrolysis solution: $5H_2O \rightarrow 10H^+ + 5O^{2-}$
Anode: $2Ta + 5O^{2-} \rightarrow Ta_2O_5 + 10e^-$
Cathode: $10H^+ + 10e^- \rightarrow 5H_2$ In the above anodic oxidation step, the first intermediate film 14 acts as a barrier layer and prevents the underlying conductive film 12 (e.g., copper) from diffusing into the tantalum film 16 upon oxidizing the tantalum film 16 by the anodic oxidation. Also, the first intermediate film 14 acts as an adhesive layer that improves adhesiveness between the conductive film 12 and the tantalum film 16.

Figure 3D:
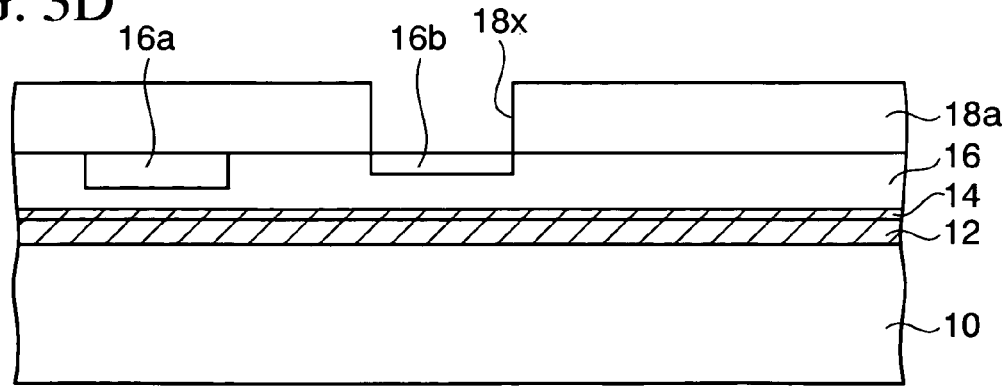

Then, as shown in FIG. 3D, a second resist film 18a in which the opening portion 18x is provided in its portion, in which a second dielectric film of a second capacitor is formed, on the tantalum film 16 is formed on the tantalum film 16 and the first tantalum oxide film 16a. Then, the portion of the tantalum film 16 exposed from the opening portion 18x in the second resist film 18a is oxidized by the second anodic oxidation. Thus, a second tantalum oxide film 16b whose film thickness is smaller than the first tantalum oxide film 16a is formed. In the second anodic oxidation step, the second tantalum oxide film 16b of almost 270 nm film thickness is formed by applying the voltage up to 180 V in a constant current mode in the first anodic oxidation method used to form the above first tantalum oxide film 16a. Then, the second resist film 18a is removed.

Figure 3E:
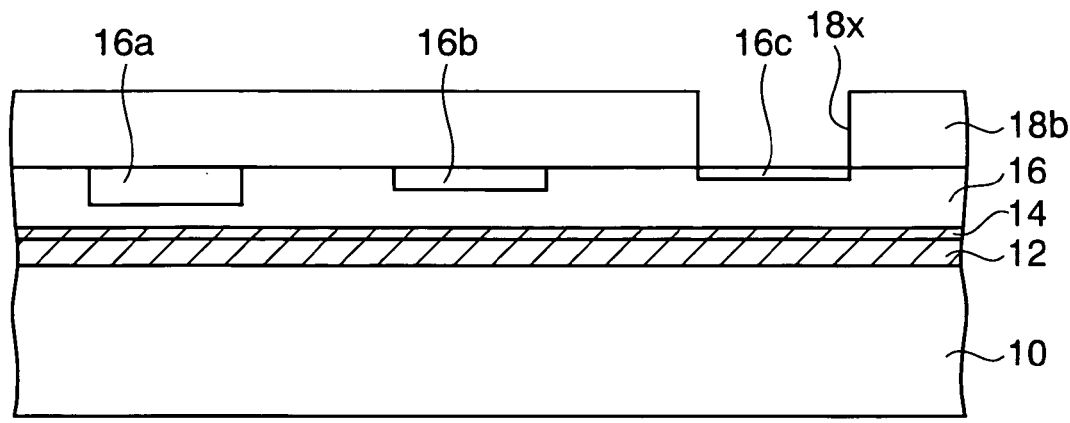

Then, as shown in FIG. 3E, a third resist film 18b in which the opening portion 18x is provided in its portion, in which a third dielectric film of a third capacitor is formed, on the tantalum film 16 is formed on the tantalum film 16 and the first and second tantalum oxide films 16a, 16b. Then, the portion of the tantalum film 16 exposed from the opening portion 18x in the third resist film 18b is oxidized by the third anodic oxidation. Thus, a third tantalum oxide film 16c whose film thickness is smaller than the second tantalum oxide film 16b is formed. In the third anodic oxidation step, the third tantalum oxide film 16c of almost 90 nm film thickness is formed by applying the voltage up to 60 V in a constant current mode in the first anodic oxidation method used to form the above first tantalum oxide film 16a. Then, the third resist film 18b is removed.

Figure 3F:
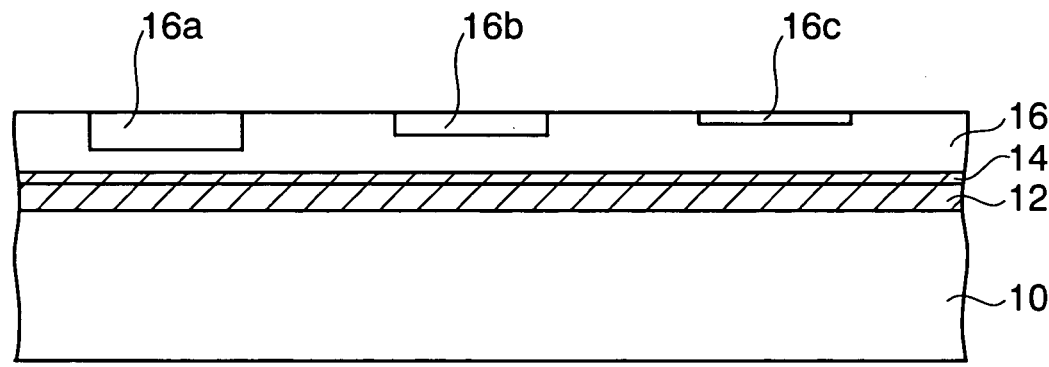

With the above, as shown in FIG. 3F, the first, second, and third tantalum oxide films 16a, 16b, 16c, film thicknesses of which are different mutually, are formed on predetermined portions of the tantalum film 16 respectively.

In the present embodiment, the tantalum film 16 is formed on the overall surface, then the resist film 18 in which the opening portion 18x is provided in the predetermined portion is patterned, and then the tantalum film 16 exposed from the opening portion 18x is oxidized in the film thickness direction to form the first tantalum oxide film 16a. Then, the first, second, and third tantalum oxide films 16a, 16b, 16c whose film thickness is different respectively are formed on different portions of the tantalum film 16 respectively by repeating these steps. In addition, a plurality of tantalum oxide films (the dielectric film) whose film thickness is different respectively can be easily formed by adjusting the applied voltage in the anodic oxidation step.

In this case, like the above anodic oxidation method, it is preferable that first the tantalum oxide film whose film thickness is thick should be formed by applying a high voltage and then the tantalum oxide film whose film thickness is thin should be formed by applying a low voltage. This is because, in the method of first forming the thin tantalum oxide film and then forming the thick tantalum oxide film, it is possible that the already-formed tantalum oxide film is further oxidized in forming the thick tantalum oxide film by the high-voltage anodic oxidation to cause a variation in the film thickness in the case where the defect is generated in the resist film.

In the above example, three tantalum oxide films 16a, 16b, 16c (dielectric films) each having the different film thickness are formed. N pieces of dielectric films having the different film thickness mutually may be formed by repeating a series of steps n times (where n is an integer of 2 or more). Also, various valve metal oxide film may be formed as the dielectric film by oxidizing other valve metal films.

Figure 3G:
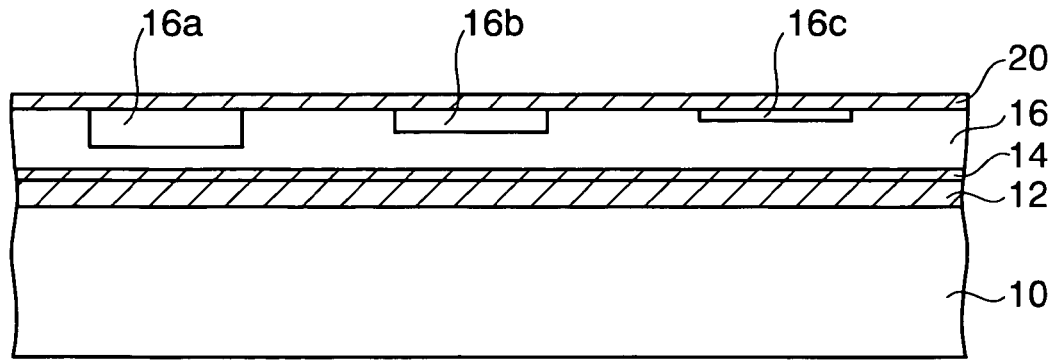

Then, as shown in FIG. 3G, a second intermediate film 20 is formed by forming a Ti film or a chromium (Cr) film on an upper surface of a structure in FIG. 3F. The second intermediate film 20 is formed to improve the adhesiveness between the tantalum oxide films 16a, 16b, 16c and the upper electrode formed later.

Figure 3H:
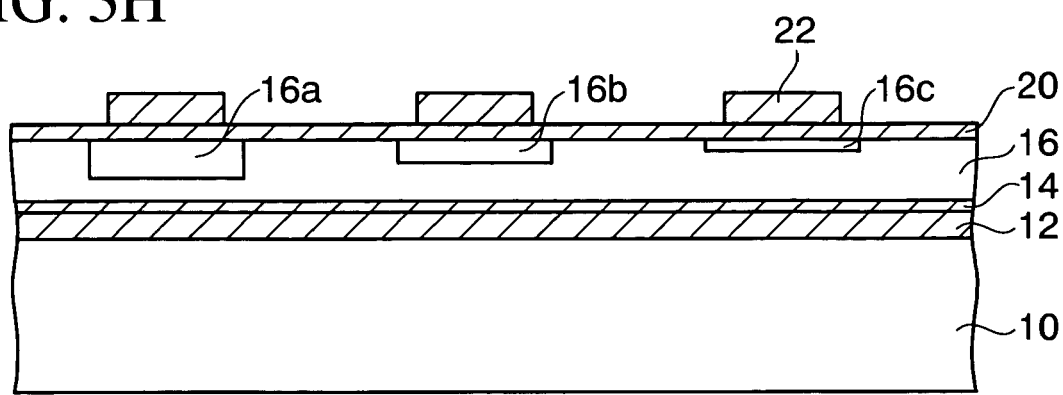

Then, as shown in FIG. 3H, metal film patterns 22 are formed on the second intermediate film 20. The metal film patterns 22 are formed by the semi-additive method, for example. In more detail, a seed Cu film (not shown) is formed on the second intermediate film 20, and then a resist film (not shown) in which opening portions in which the upper electrode is formed are provided is formed on the seed Cu film. Then, Cu film patterns are formed in the opening portions in the resist film by the electroplating utilizing the seed Cu film as the plating power-supply layer. Then, the resist film is removed, and then the metal film patterns 22 are obtained by etching the seed Cu film while using the Cu film patterns as a mask.

Figure 3I:
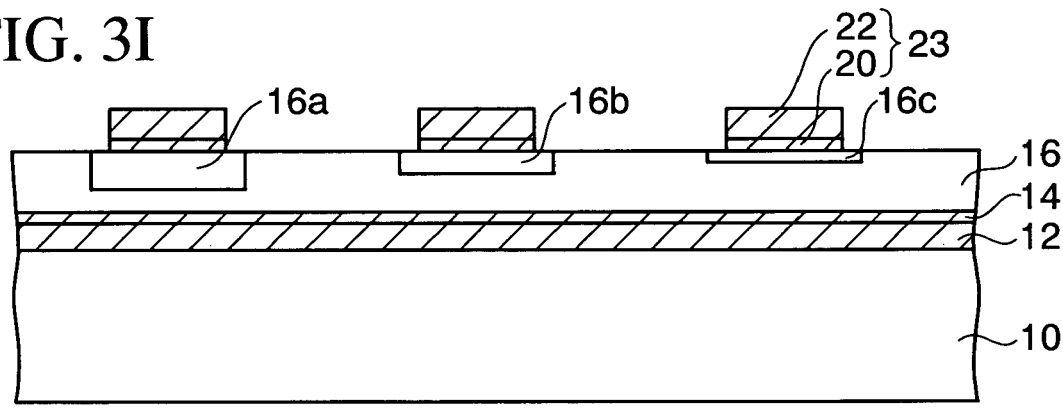

Then, as shown in FIG. 3I, capacitor upper electrodes 23 each consisting of the second intermediate film 20 and the metal film pattern 22 are obtained by etching the second intermediate film 20 while using the metal film patterns 22 as a mask. The capacitor upper electrodes 23 are patterned on the tantalum oxide films 16a, 16b, 16c in such a manner that respective contact areas to a plurality of tantalum oxide films 16a, 16b, 16c are set identical.

Figure 3J:
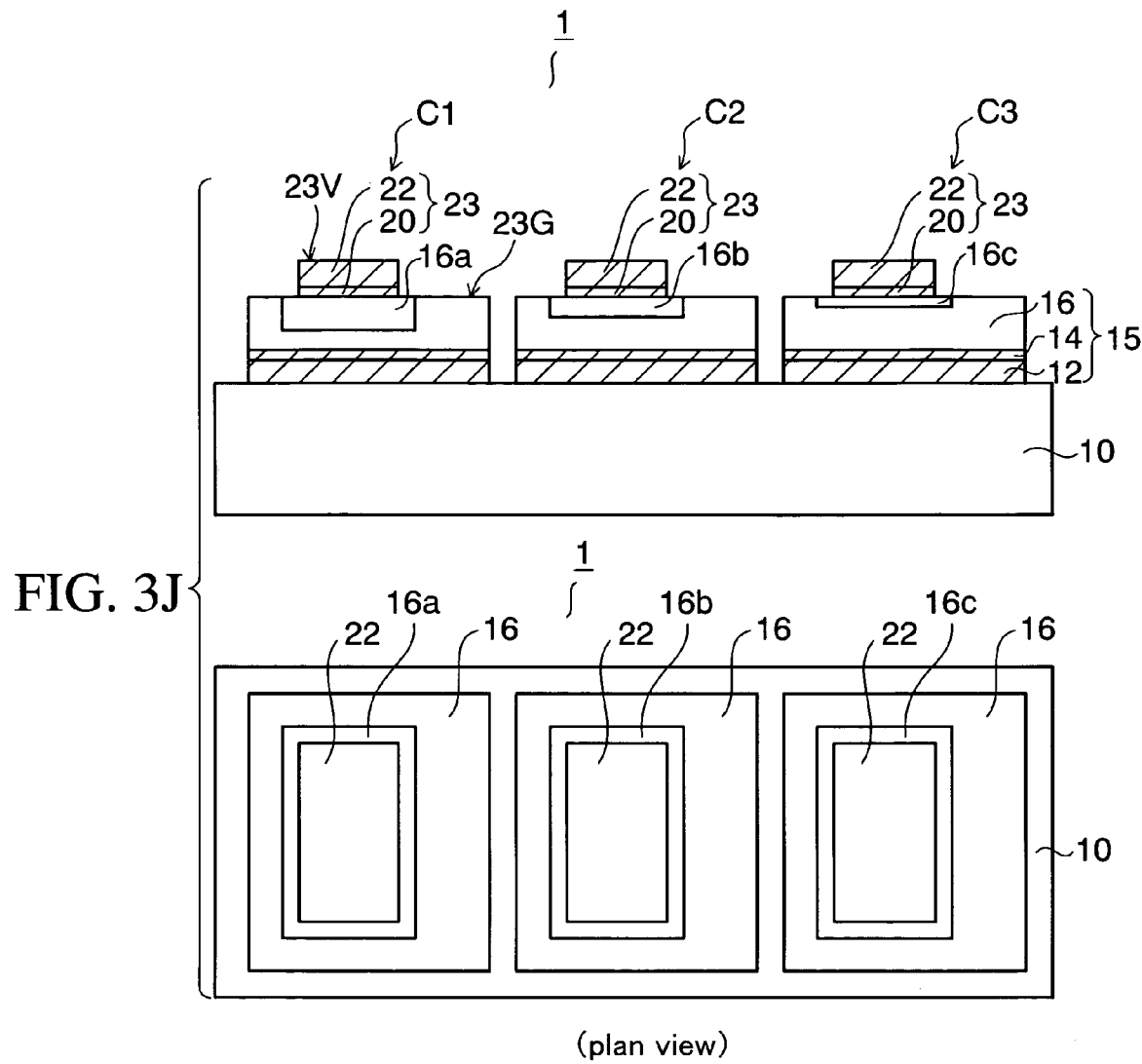

Then, as shown in FIG. 3J, in order to obtain predetermined lower electrodes, a resist film (not shown) is patterned on an upper surface of a structure in FIG. 3I, then the tantalum film 16, the first intermediate layer 14, and the conductive film 12 are etched by using the resist film as a mask, and then the resist film is removed. Thus, lower electrodes 15 each consisting of the conductive film 12, the first intermediate layer 14, and the tantalum film 16 are formed. At this time, the lower electrode 15 is formed in a state that the upper surface of the tantalum film 16 is exposed. Then, the core substrate 10 is cut to get a predetermined number of capacitors.

With the above, a capacitor device 1 of the present embodiment constructed by a first capacitor C1, a second capacitor C2, and a third capacitor C3 is manufactured.

In the present embodiment, a mode in which three capacitors in which the film thicknesses of the tantalum oxide films (dielectric films) are different mutually are formed is exemplified. The number of the capacitors is not particularly limited, and n pieces (where n is an integer of 2 or more) of capacitors in which the film thicknesses of the dielectric films are different mutually to accord with the characteristics of the decoupling capacitor device may be formed. Also, the capacitors having same film thicknesses of the dielectric films and equal electrostatic capacities may be mixed among a plurality of capacitors.

In the capacitor device 1 of the present embodiment, upper surfaces of the upper electrodes 23 of respective capacitors C1, C2, C3 in FIG. 3J act as a power-supply connecting portion 23V that is connected to the power-supply line (+) of the circuit substrate, and the upper surfaces of the tantalum films 16 of the lower electrodes 15 act as a ground connecting portion 23G that is connected to the ground line (−) of the circuit substrate.

In the capacitor device 1 of the present embodiment, as shown in FIG. 3J, the first capacitor C1, the second capacitor C2, and the third capacitor C3 are formed on the core substrate 10 as one chip. The first capacitor C1 consists of the lower electrode 15, the first tantalum oxide film 16a, and the upper electrode 23. The second capacitor C2 consists of the lower electrode 15, the second tantalum oxide film 16b whose film thickness is smaller than the first tantalum oxide film 16a, and the upper electrode 23. Also, the third capacitor C3 consists of the lower electrode 15, the third tantalum oxide film 16c whose film thickness is smaller than the second tantalum oxide film 16b, and the upper electrode 23.

In this manner, the film thicknesses of respective tantalum oxide films 16a, 16b, 16c (dielectric films) are set differently mutually in respective capacitors C1, C2, C3, and thus the electrostatic capacities of respective capacitors C1, C2, C3 are set differently mutually. Also, the areas of the upper electrodes 23, which contact the tantalum oxide films 16a, 16b, 16c (areas of the portions of the dielectric films constituting the capacitors), are formed equal to each other, and thus the inductances of respective capacitors C1, C2, C3 are set identically.

Figure 4:
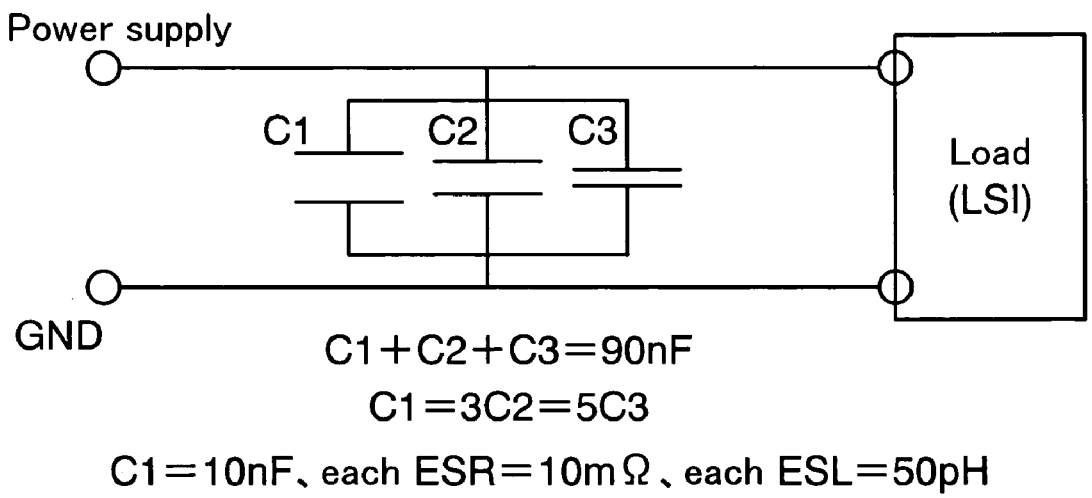
FIG. 4 is a diagram showing an equivalent circuit when the capacitor device according to the first embodiment of the present invention is applied to the decoupling capacitor.
Figure 5:
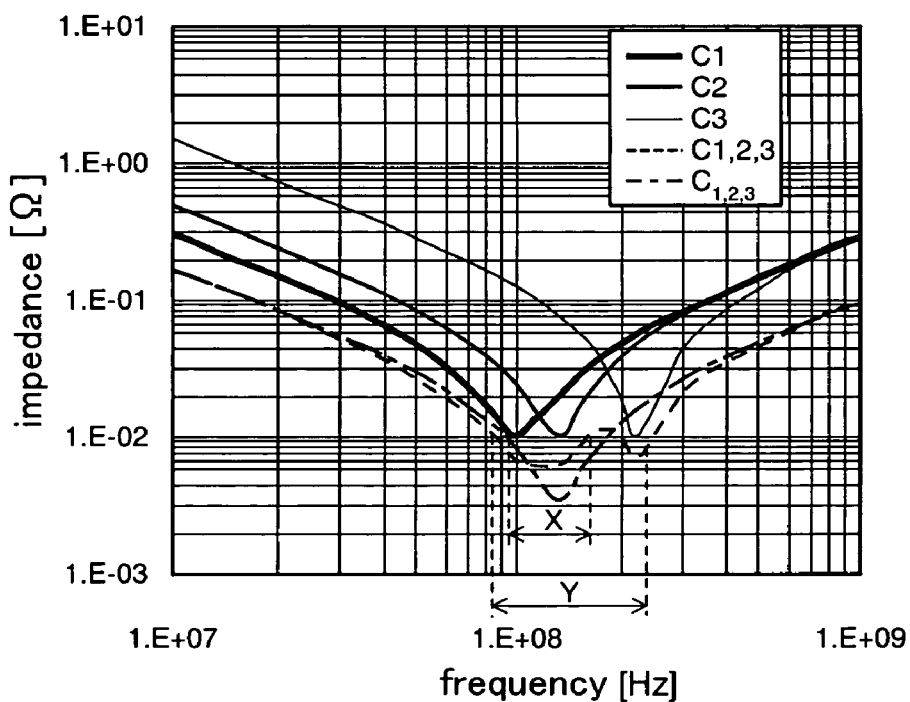
FIG. 5 is a view showing the impedance characteristics of the capacitor device in FIG. 4.

FIG. 4 is a diagram showing an equivalent circuit when the capacitor device according to the first embodiment of the present invention is applied to the decoupling capacitor. FIG. 5 is a view showing the impedance characteristic of the capacitor device in FIG. 4.

As shown in FIG. 4, in the capacitor device 1 of the present embodiment, respective capacitors C1, C2, C3 of the capacitor device 1 are connected in parallel between the power-supply line and the ground line of the circuit substrate on which the load (LSI) is mounted.

The impedance characteristics of the capacitor device 1 of the present embodiment are shown in FIG. 5, wherein curves indicated by solid lines show individual impedance characteristics of the capacitors C1, C2, C3 respectively. The electrostatic capacities of respective capacitors C1, C2, C3 are set at this time to satisfy relationships of $C1+C2+C3=90$ nF and $C1=3C2=5C3$. The electrostatic capacity of C1 is 10 nF, and each ESR of respective capacitors C1, C2, C3 is 10 mΩ and each ESL is 50 pH.

As shown in FIG. 5, it is appreciated that resonance frequencies are shifter mutually by changing the electrostatic capacities of respective capacitors C1, C2, C3. The impedance characteristic of the decoupling capacitor C1,2,3, which is constructed by connecting respective capacitors C1, C2, C3 in parallel, of the present embodiment is indicated by a broken line. A frequency range Y in which the impedance is reduced smaller than 10 mΩ or less is 80 to 250 MHz.

By way of comparison the impedance characteristic of the decoupling capacitor $C_{1,2,3}$, which is constructed by connecting three capacitors having the same electrostatic capacity shown in FIG. 1 in parallel, is indicated by a chain line in FIG. 5. As described above, a frequency range X in which the impedance is reduced smaller than 10 mΩ or less is 90 to 180 MHz.

In this way, the low impedance can be given in a wide frequency band by connecting a plurality of capacitors each having the different electrostatic capacity in parallel.

In the present embodiment, since the resonance frequencies of the capacitors are shifted by changing the electrostatic capacities of respective capacitors C1, C2, C3, the impedance can be lowed over a wide frequency band. In this case, the resonance frequency of the capacitor depends on not only the electrostatic capacity but also the inductance.

In the method of changing the electrostatic capacity of each capacitor by changing the area of the dielectric film constituting the capacitor, unlike the present embodiment, the inductance is also changed between respective capacitors. Therefore, the impedance reduction must be attained while taking account of the electrostatic capacity and the inductance and thus the electrical design becomes complicated.

However, in the present embodiment, as described above, the areas of the portions of the dielectric films constituting the capacitors are set identically among respective capacitors C1, C2, C3, nevertheless the electrostatic capacity of each capacitor is changed by the film thickness of the dielectric film. Therefore, the inductance can be set identically among respective capacitors C1, C2, C3.

As a result, in the present embodiment, there is no necessity for taking changes of the inductances of respective capacitors C1, C2, C3 into consideration, and only the change of the electrostatic capacity may be considered. In addition, the resonance frequency of the capacitor has such a characteristic that such frequency changes in inverse proportion to the electrostatic capacity.

From the above explanation, in the capacitor device 1 of the present embodiment, the electrical design may be conducted to attain the impedance reduction in a wide frequency band while considering only the electrostatic capacity. Therefore, such electrical design can be made extremely easy.

Next, a variation of the capacitor device of the present embodiment will be explained hereunder. In the above embodiment, as shown in FIG. 3J, the upper electrodes 23 are patterned respectively such that the upper surfaces of the tantalum films 16 of the lower electrodes 15 in respective capacitors C1, C2, C3 are exposed collectively. In this case, one terminal is connected to the power-supply connecting portion 23V of the upper electrode 23 and the ground connecting portion 23G of the lower electrode 15 respectively.

Figure 6:
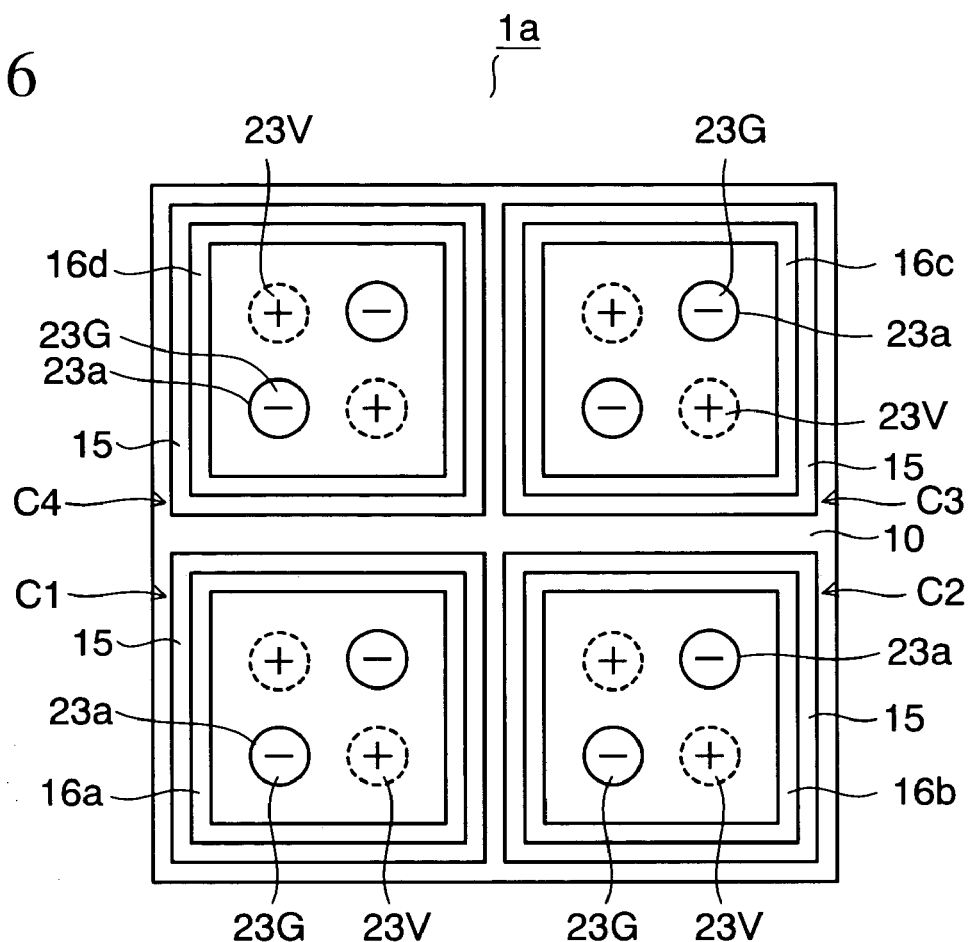
FIG. 6 is a plan view showing a variation of the capacitor device according to the first embodiment of the present invention.
Figure 7:
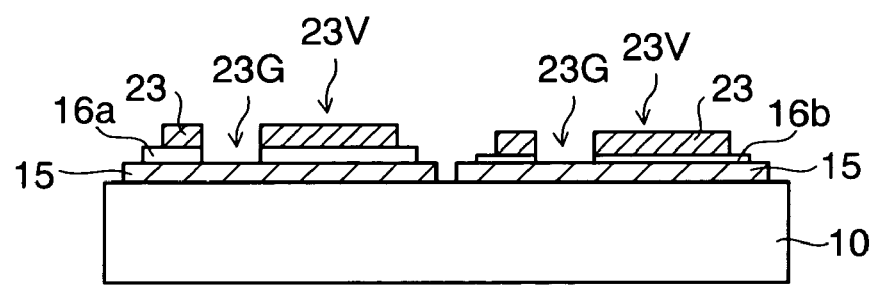
FIG. 7 is a sectional view showing the variation of the same capacitor device.

As shown in FIG. 6 and FIG. 7, in a capacitor device 1a in the variation of the present embodiment, four lower electrodes 15 are formed on the core substrate 10 respectively, and first to fourth tantalum oxide films 16a to 16d that are formed by applying the anodic oxidation to the tantalum films to have a different film thickness respectively are formed into patterns on the lower electrodes 15. Then, the upper electrode 23 is formed on the first to fourth tantalum oxide films 16a to 16d respectively. In this way, the first to fourth capacitors C1, C2, C3, C4 are arranged on the core substrate 10 respectively.

A plurality of opening portions 23a are formed (two opening portions are formed every capacitors C1 to C4 in an example in FIG. 6 and FIG. 7) in predetermined portions of the upper electrodes 23 and the tantalum oxide films 16a to 16d in the capacitors C1 to C4 respectively. The upper surface of the lower electrode 15 is exposed from bottom portions of the opening portions 23a. Then, portions of the lower electrodes 15 exposed from a plurality of opening portions 23a act as the ground connecting portion 23G(−) respectively. Also, a plurality of power-supply connecting portions 23V(+) are defined on the upper surface of the upper electrode 23 as many as a plurality of ground connecting portions 23G on the lower electrodes 15.

In this case, the first and second intermediate layers are omitted from illustrations in FIG. 6 and FIG. 7. As the lower electrode 15 exposed from the bottom portions of the opening portions 23a, any film (the tantalum film 16, the first intermediate film 14, or the conductive film 12) constituting the lower electrode may be employed.

In the case where the above variation is employed, the inductances in respective capacitors C1 to C4 can be reduced uniformly since a plurality of terminals are connected to the upper electrodes 23 and the lower electrode 15 respectively. Thus, the impedance can be further reduced in the capacitor device 1a in the variation.

Next, an example of an electronic parts packaging structure in which the capacitor device 1 according to the present embodiment is built as the decoupling capacitor will be explained hereunder. FIGS. 8A to 8H are sectional views showing a method of manufacturing an electronic parts packaging structure in which the capacitor device according to the first embodiment of the present invention is built.

Figure 8A:
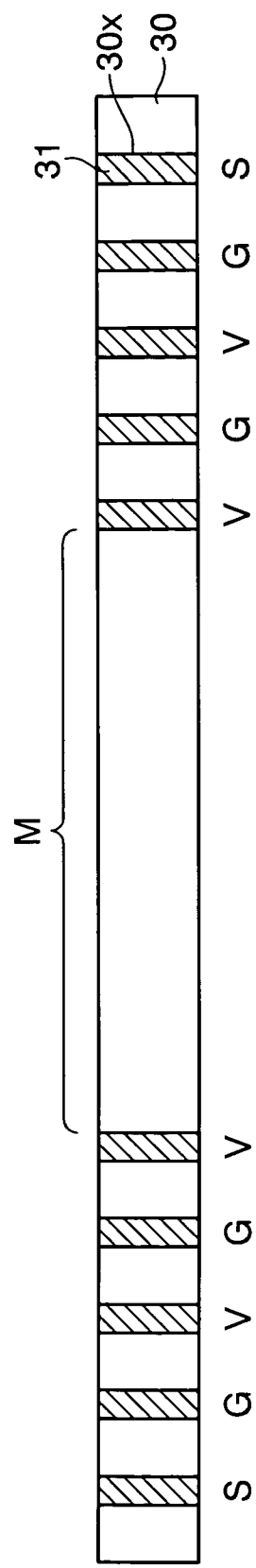

First, as shown in FIG. 8A, a base substrate 30 having a packaging area M, on which the foregoing capacitor device 1 is mounted, in its center portion is prepared. It is preferable that a glass-epoxy substrate should be used as the base substrate 30. Through holes 30x are provided in the base substrate 30, and a through electrode 31 made of conductor such as Cu, or the like is filled in the through holes 30x respectively. A plurality of through electrodes 31 in the base substrate 30 constitute power-supply lines V, ground lines G, and signal lines S respectively.

Figure 8B:
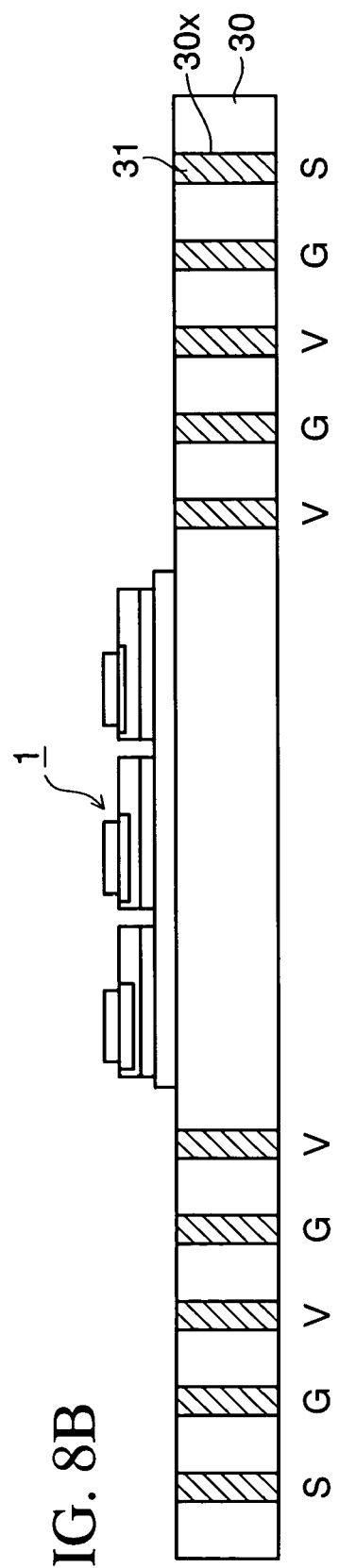

Then, as shown in FIG. 8B, the above capacitor device 1 is adhered to the packaging area M of the base substrate 30 via an adhesive layer (not shown) in a state that its surface on which the capacitors are formed is directed upward. Then, as shown in FIG. 8C, a first interlayer insulating film 34 is formed on both surfaces of the base substrate 30 respectively by pasting a resin film onto the surfaces, or the like. Thus, the capacitor device 1 is buried in the first interlayer insulating film 34. Then, predetermined portions of the first interlayer insulating film 34 on the upper electrodes 23, the lower electrodes 15, and the through electrodes 31 of the capacitor device 1 are processed by the laser, or the like, and thus first via holes 34x are formed. Also, the first via holes 34x are formed in the first interlayer insulating film 34 on the through electrodes 31 on the back surface side of the base substrate 30.

Then, as shown in FIG. 8D, first wiring patterns 36 connected to the upper electrodes 23, the lower electrodes 15, and the through electrodes 31 of the capacitor device 1 via the first via holes 34x respectively are formed on the first interlayer insulating film 34. At this time, the upper electrodes 23 of the capacitor device 1 are connected electrically to the power-supply lines V of the base substrate 30 via the first wiring patterns 36 respectively. Then, the first wiring patterns 36 connected to the through electrodes 31 in the base substrate 30 via the first via holes 34x respectively are also formed on the first interlayer insulating film 34 on the back surface side of the base substrate 30.

Figure 8E:
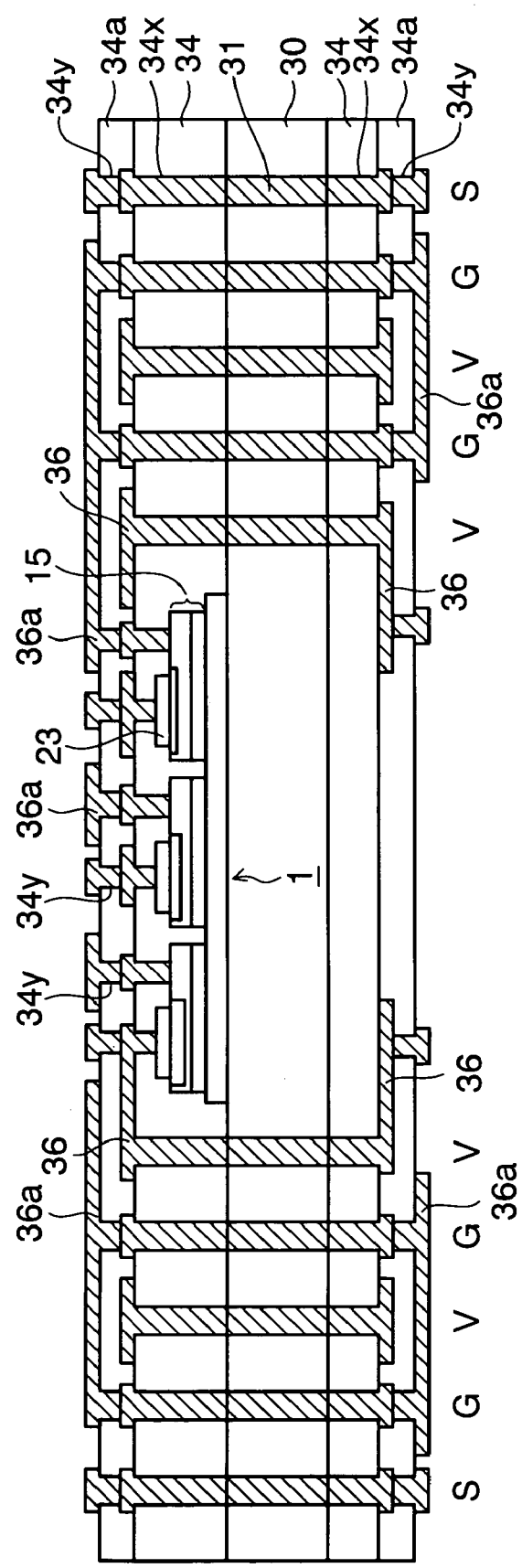

Then, as shown in FIG. 8E, a second interlayer insulating film 34a for coating the first wiring patterns 36 on both surface sides of the base substrate 30 is formed respectively. Then, second via holes 34y are formed in predetermined portions of the second interlayer insulating film 34a on the first wiring patterns 36 on both surface sides of the base substrate 30 respectively. Then, as also shown in FIG. 8E, second wiring patterns 36a connected to the first wiring patterns 36 via the second via holes 34y on both surface sides of the base substrate 30 are formed on the second interlayer insulating film 34a respectively. As a result, the lower electrodes 15 of the capacitor device 1 are connected electrically to the ground lines G in the base substrate 30 via the first and second wiring patterns 36, 36a respectively.

Then, as shown in FIG. 8F, the above processes are repeated. Thus, third wiring patterns 36b connected to the second wiring patterns 36a on both surface sides of the base substrate 30 via third via holes 34z formed in third interlayer insulating films 34b respectively are formed on the third interlayer insulating films 34b respectively.

At this time, power-supply connecting portions 36V are defined in predetermined portions of the upper electrodes 23 of the capacitor device 1 and the third wiring patterns 36b connected to the power-supply lines V of the base substrate 30. Also, ground connecting portions 36G are defined in predetermined portions of the lower electrodes 15 of the capacitor device 1 and the third wiring patterns 36b connected to the ground lines G of the base substrate 30. In addition, signal connecting portions 36S are defined in predetermined portions of the third wiring patterns 36b connected to the signal lines S of the base substrate 30. Also, the power-supply connecting portions 36V, the ground connecting portions 36G, and the signal connecting portions 36S are defined in the third wiring patterns 36b exposed on the back surface side of the base substrate 30.

Figure 8G:
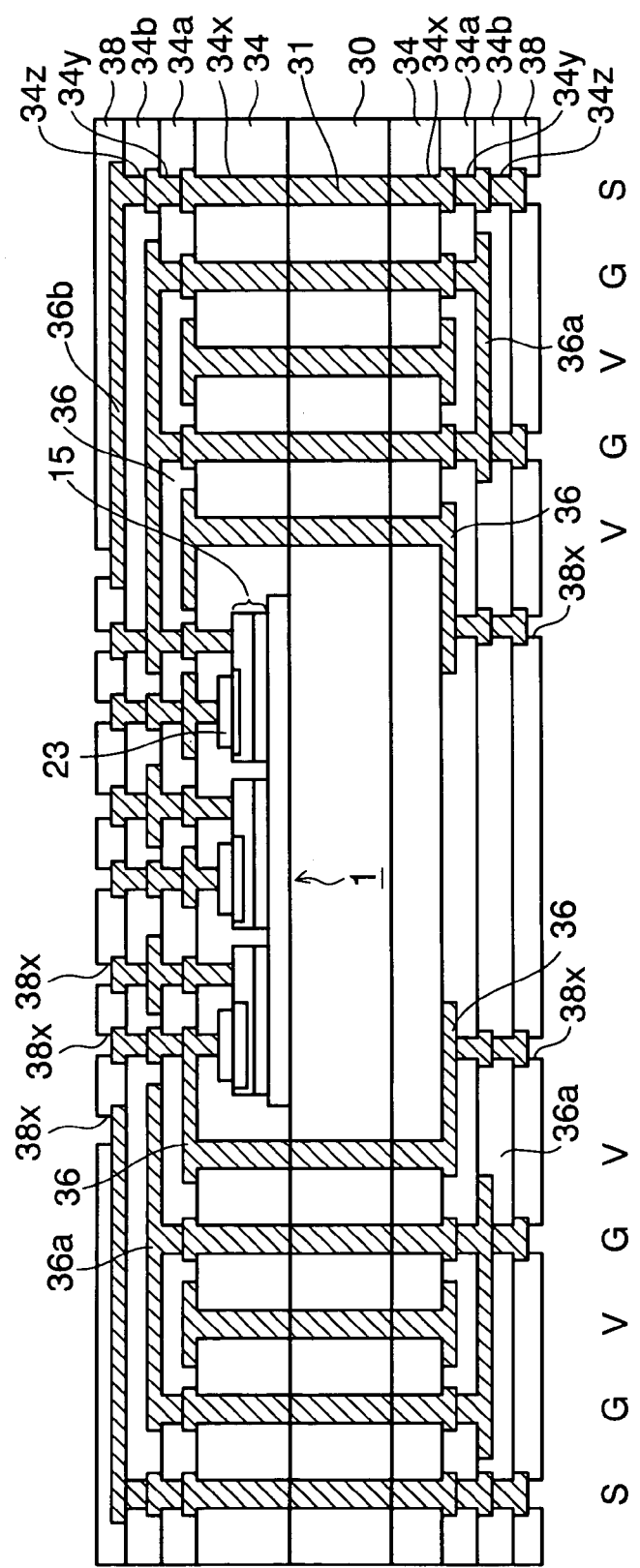

Then, as shown in FIG. 8G, a solder resist film 38 in which opening portions 38x are provided on the power-supply connecting portions 36V, the ground connecting portions 36G, and the signal connecting portions 36S of the third wiring patterns 36b on both surface sides of the base substrate 30 is formed on both surfaces of the structure in FIG. 8F respectively. Then, a Ni/Au layer (not shown) is selectively formed on the power-supply connecting portions 36V, the ground connecting portions 36G, and the signal connecting portions 36S on both surface sides of the base substrate 30 by the electroless plating respectively.

Figure 8H:
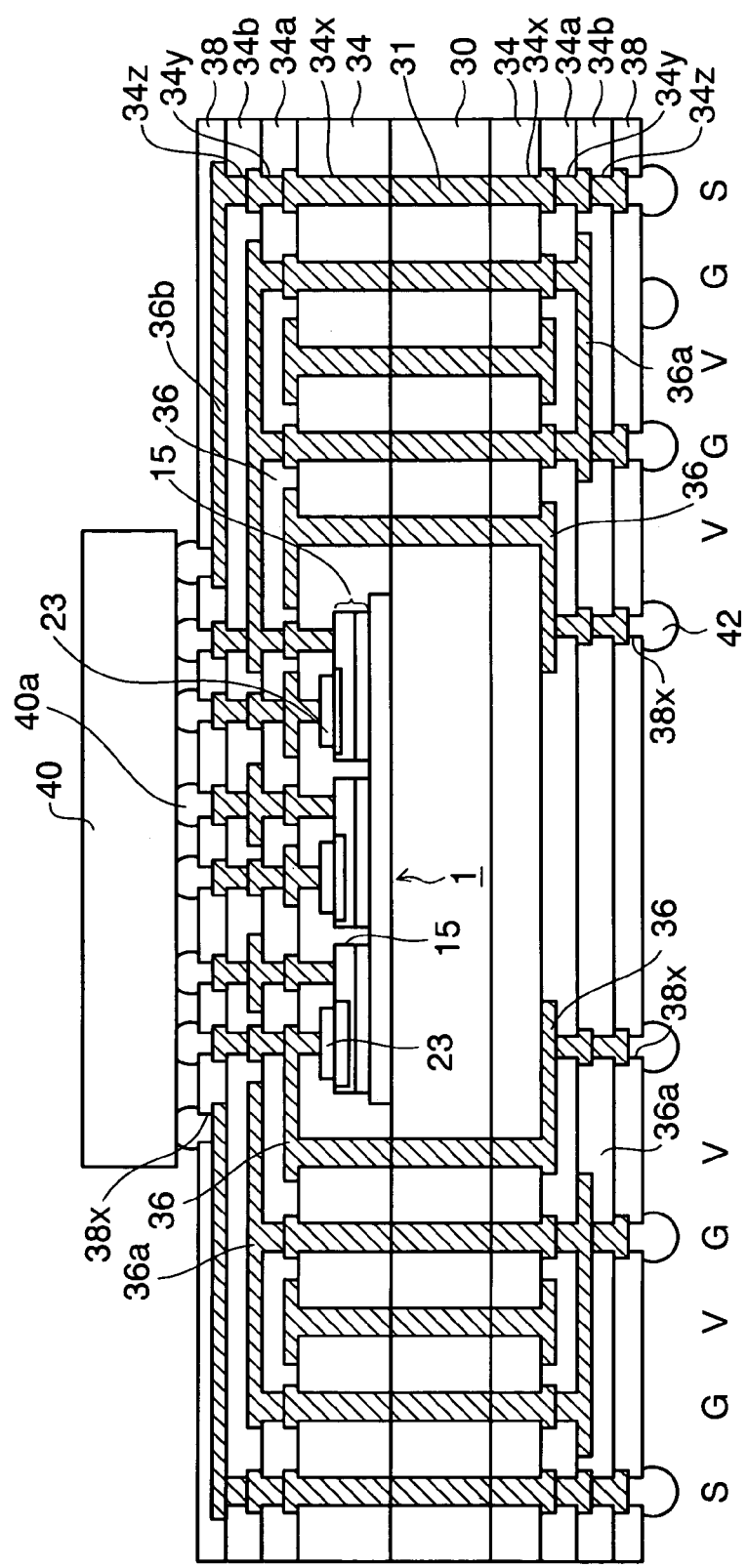

Then, as shown in FIG. 8H, an electronic parts 40 (a semiconductor chip, or the like) having bumps 40a thereon is prepared. The bumps 40a of the electronic parts 40 are flip-chip connected to respective connecting portions 36V, 36G, 36S (FIG. 8) of the third wiring patterns 36b on the upper surface side of the base substrate 30.

Then, bumps 42 are mounted onto respective connecting portions 36V, 36G, 36S (FIG. 8) of the third wiring patterns 36b on the back surface side of the base substrate 30.

With the above, an electronic parts packaging structure 2 in which the capacitor device 1 of the present embodiment is built is completed.

As shown in FIG. 8H, in the circuit substrate of the electronic parts packaging structure 2 in the present embodiment, the interlayer insulating films 34 to 34b and the wiring patterns 36 to 36b are stacked alternately on both surfaces of the base substrate 30 in which the through electrodes 31 are provided, and then the wiring patterns 36 to 36b are connected mutually via the via holes 34x to 34z provided in the interlayer insulating films 34 to 34b. Then, the capacitor device 1 is mounted on the base substrate 30 in a state that such device is buried in the first interlayer insulating film 34.

Then, with reference to FIG. 8H together with the above equivalent circuit in FIG. 4, the upper electrodes 23 of three capacitors C1, C2, C3 of the capacitor device 1 are connected to the power-supply lines V in the base substrate 30 via the first wiring patterns 36 respectively. Also, the lower electrodes 15 of three capacitors C1, C2, C3 are connected to the ground lines G of the circuit substrate via the first and second wiring patterns 36, 36a respectively.

In addition, the electronic parts 40 is packaged over the capacitor device 1 that is built in the circuit substrate. The bumps 40a of the electronic parts 40 are connected to the power-supply connecting portions 36V and the ground connecting portions 36G of the third wiring patterns 36b, which are connected to the upper electrodes 23 (power-supply lines) and the lower electrodes 15 (ground lines) of the capacitor device 1 respectively, and also connected to the signal connecting portions 36S of the third wiring patterns 36b, which are connected to the signal lines in the circuit substrate.

In this fashion, respective capacitors C1, C2, C3 constituting the capacitor device 1 are connected in parallel between the power-supply line and the ground line connected from the circuit substrate to the electronic parts 40.

Then, in the electronic parts packaging structure 2 of the present embodiment, the high-frequency current (high-frequency noise) generated from the electronic parts 40 is exhausted into the ground line G to go round the capacitor device 1 that is arranged directly under the electronic parts 40. Also, even though a voltage variation is caused in the electronic parts 40 due to a switching operation of the electronic parts 40, a voltage variation in the power-supply terminal portions of the electronic parts 40 can be suppressed by an action of the capacitor device 1.

In the capacitor device 1 in the present embodiment, since the low impedance can be derived over a wide frequency band, as described above, the performance as the decoupling capacitor can be improved.

Also, in the capacitor device 1 in the present embodiment, since a plurality of capacitors each having the different electrostatic capacity are incorporated into one chip, it is unnecessary to package a plurality of individual capacitor parts whose electrostatic capacities are different. Therefore, a packaging cost can be reduced and also a packaging density can be improved.

In addition, a thickness of the capacitor device 1 in the present embodiment can be reduced by reducing a thickness of the core substrate 10, and can also be arranged immediately under the electronic parts 40. Therefore, the parasitic inductance can be largely reduced. As a result, an effect of suppressing a variation in the power-supply voltage applied to the high-speed operated electronic parts and also reducing the high-frequency noise can be enhanced.

Second Embodiment

Figure 9A:
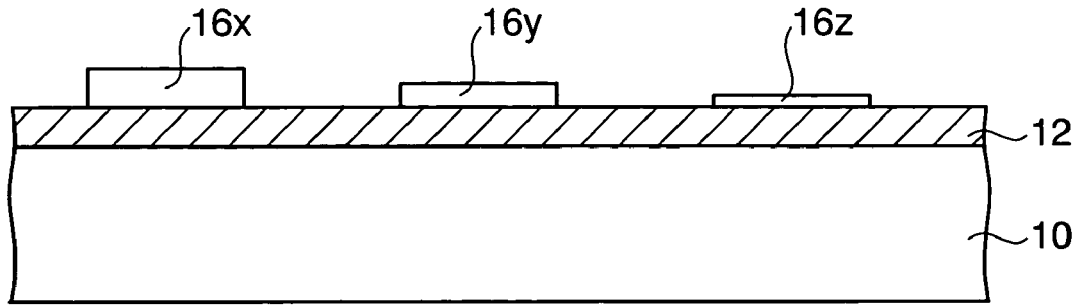
FIGS. 9A to 9C are sectional views showing a method of manufacturing a capacitor device according to a second embodiment of the present invention.
Figure 9B:
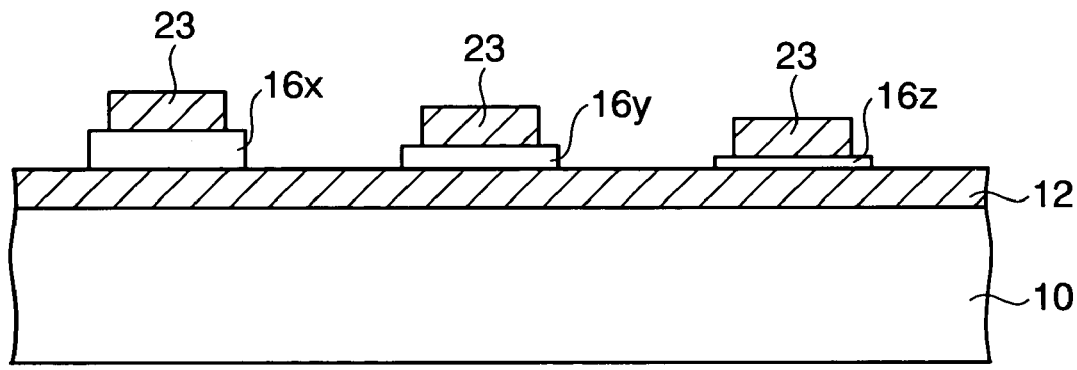
Figure 9C:
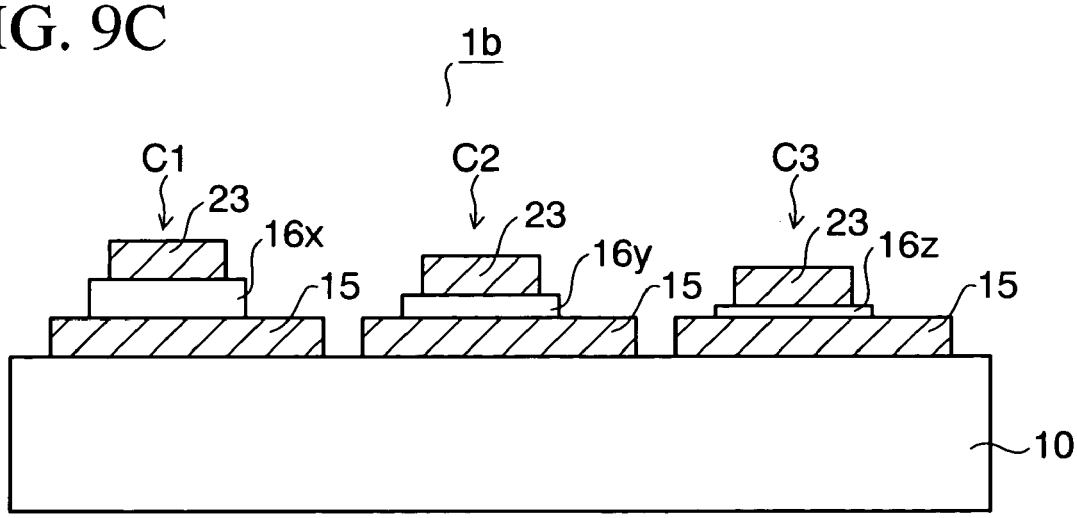

FIGS. 9A to 9C are sectional views showing a method of manufacturing a capacitor device according to a second embodiment of the present invention. A difference of the second embodiment from the first embodiment is that a method of forming the dielectric film is different. Detailed explanation of the same steps as those in the first embodiment will be omitted herein.

First, as shown in FIG. 9A, the conductive film 12 is formed on the core substrate 10. Then, a first dielectric film pattern 16x is formed in the portion of the conductive film 12 in which the dielectric film of the first capacitor is formed. As a method of forming the first dielectric film pattern 16x, there is a lift-off method, for example. More particularly, first a resist film (not shown) having an opening portion in a predetermined portion is patterned. Then, a dielectric film such as a tantalum oxide film, or the like is formed on the resist film and in the opening portion by the sputtering method, or the like. Then, the dielectric film formed in the opening portion in the resist film is selectively left by releasing the resist film, and thus the first dielectric film pattern 16x is obtained.

Then, similar steps are carried out after the position of the opening portion in the resist film and the film thickness of the dielectric film are changed respectively. Thus, a second dielectric film pattern 16y and a third dielectric film pattern 16z, each having a different film thickness from the first dielectric film pattern 16x, are formed in seriatim. A plurality of dielectric film patterns each having the different film thickness can be formed in different areas of the conductive film 12 respectively by repeating the lift-off step predetermined times.

Alternately, the dielectric material such as PZT (Pb(Zr, Ti)O$_3$), or the like may be formed by employing a method of patterning the gel used in the sol-gel method by means of the printing using a metal mask, in which the opening portion is provided in the predetermined portion, and then sintering the gel. In this case, a plurality of dielectric film patterns each having the different film thickness can be formed by repeating the similar steps the predetermined number of times while using a plurality of metal masks that have different thickness and position of the opening portion respectively.

Then, as shown in FIG. 9B, the upper electrode 23 is patterned on the first, second, and third dielectric film patterns 16$x$, 16$y$, 16$z$ respectively. Then, as shown in FIG. 9C, the lower electrodes 15 are formed by patterning the conductive film 12. Then, the core substrate 10 is cut to get the predetermined capacitors.

As a result, like the first embodiment, a capacitor device 1$b$ constructed by the first, second, and third capacitor C1, C2, C3 in which the film thicknesses of the dielectric film are different mutually can be manufactured.

The capacitor device 1$b$ of the second embodiment can achieve the similar advantages to the first embodiment. Also, in the capacitor device 1$b$ of the second embodiment, a variation and a modification can be applied similarly to the first embodiment, and also such capacitor device can be applied to the similar decoupling capacitor to the first embodiment.

What is claimed is:

1. A capacitor device comprising:
   a substrate;
   a plurality of lower electrodes formed directly on an identical surface of the substrate;
   a plurality of dielectric films formed on the plurality of lower electrodes respectively in a state that the dielectric films are separated mutually; and
   upper electrodes formed on the plurality of dielectric films respectively;
   wherein a plurality of capacitors each composed of the lower electrode, the dielectric film, and the upper electrode are arranged on the substrate as one chip, and each of the dielectric films in the plurality of capacitors has a different film thickness, thereby electrostatic capacities of respective capacitors are different.

2. A capacitor device according to claim 1, wherein areas of portions of the dielectric films constituting the capacitors are set identically in the plurality of capacitors.

3. A capacitor device according to claim 1, wherein the dielectric films are made of a metal oxide film that is formed by applying anodic oxidation to a valve metal film from an upper surface along a film thickness direction, and the lower electrodes contain the valve metal film.

4. A capacitor device according to claim 3, wherein the valve metal film is a tantalum film, an aluminum film, or a titanium film.

5. A capacitor device according to claim 3, wherein areas in which the metal oxide film is not formed are left on upper surfaces of patterns of the valve metal film, and the upper electrodes are formed to expose upper surfaces of the areas, in which the metal oxide film is not formed, of the patterns of the valve metal film.

6. A capacitor device according to claim 3, wherein a plurality of opening portions are provided in predetermined portions of the upper electrodes and the metal oxide film, and the lower electrode is exposed from bottom portions of the opening portions.

7. A capacitor device according to claim 1, wherein the substrate is made of material that is selected from a group consisting of silicon, glass, ceramic, and resin.

8. A capacitor device according to claim 1, wherein a thickness of the substrate is 50 μm or less.

9. An electronic parts packaging structure comprising:
   a circuit substrate having a power-supply line and a ground line;
   the capacitor device set forth in claims 1 and packaged on the circuit substrate, a plurality of capacitors of the capacitor device being connected in parallel between the power-supply line and the ground line; and
   an electronic parts packaged over the capacitor device and connected between the power-supply line and the ground line.

10. An electronic parts packaging structure according to claim 9, wherein upper electrodes of the plurality of capacitors are connected to the power-supply line respectively, and lower electrodes of the plurality of capacitors are connected to the ground line respectively.

11. An electronic parts packaging structure according to claim 10, wherein the dielectric films are made of a metal oxide film that is formed by applying anodic oxidation to a valve metal film from an upper surface along a film thickness direction, and the lower electrodes contain the valve metal film;
   wherein areas in which the metal oxide film is not formed are left on upper surfaces of patterns of the valve metal film, and the upper electrodes are formed to expose upper surfaces of the areas, in which the metal oxide film is not formed, of the patterns of the valve metal film;
   and upper surfaces of the valve metal films constituting the lower electrodes are connected to the ground line respectively.

* * * * *